United States Patent [19]   [11]  4,442,589
Doo et al.   [45]  Apr. 17, 1984

[54] METHOD FOR MANUFACTURING FIELD EFFECT TRANSISTORS

[75] Inventors: Ven Y. Doo, San Jose, Calif.; Paul J. Tsang, Poughkeepsie, N.Y.

[73] Assignee: IBM, Armonk, N.Y.

[21] Appl. No.: 240,677

[22] Filed: Mar. 5, 1981

[51] Int. Cl.³ ............... H01L 21/265; H01L 21/28
[52] U.S. Cl. ............................ 29/571; 29/576 B; 29/578; 148/187
[58] Field of Search .................. 29/571, 576 B, 578; 148/1.5, 187

[56] References Cited

U.S. PATENT DOCUMENTS

| | | | |
|---|---|---|---|
| 3,846,822 | 11/1974 | Riley et al. | 29/571 X |
| 4,033,026 | 7/1977 | Pashley | 29/578 X |
| 4,038,107 | 7/1977 | Marr et al. | 357/91 X |
| 4,074,300 | 2/1978 | Sakai et al. | 357/23 S |
| 4,078,947 | 3/1978 | Johnson et al. | 148/187 X |
| 4,079,504 | 3/1978 | Kosa | 148/187 X |
| 4,099,987 | 7/1978 | Jambotkar | 357/91 X |
| 4,101,922 | 7/1978 | Tihanyi et al. | 357/22 X |
| 4,173,818 | 11/1979 | Bassous et al. | 29/571 |
| 4,209,349 | 6/1980 | Ho et al. | 148/174 X |
| 4,234,362 | 11/1980 | Riseman | 29/571 X |
| 4,272,881 | 6/1981 | Angle | 29/571 |
| 4,296,426 | 10/1981 | Gilles | 29/571 |
| 4,312,680 | 1/1982 | Hsu | 29/571 X |
| 4,342,149 | 8/1982 | Jacobs et al. | 29/571 X |

FOREIGN PATENT DOCUMENTS

| | | |
|---|---|---|
| 2950413 | 6/1980 | Fed. Rep. of Germany . |
| 2445618 | 7/1980 | France . |
| 2038088 | 7/1980 | United Kingdom . |

OTHER PUBLICATIONS

IBM Technical Disclosure Bulletin, vol. 19, No. 4, Sep. 1976, pp. 1162 and 1163.
IBM Technical Disclosure Bulletin vol. 21, No. 12, May 1979, pp. 5035-5038.

Primary Examiner—G. Ozaki
Attorney, Agent, or Firm—Sughrue, Mion, Zinn, Macpeak & Seas

[57] ABSTRACT

A transistor and method of forming the same are disclosed. A thick mesa of dielectric material is grown on a semiconductor substrate and two or more layers of polycrystalline silicon grown on the vertical sides of the mesa serve a masking function to define the gate region of the transistor with high accuracy. The mesa and the two or more polycrystalline layers remain in the final device.

9 Claims, 5 Drawing Figures

METHOD FOR MANUFACTURING FIELD EFFECT TRANSISTORS

BACKGROUND OF THE INVENTION

1. Field of the Invention

The present invention relates to a method for manufacturing field effect transistors (FETS) having an extremely short channel with greatly improved punch-through, channel breakdown, and hot electron trapping characteristics.

2. Development of the Invention

It is well known in the art that the speed of a MOSFET is determined primarily by channel length and parasitic capacitance, speed improving as channel length and parasitic capacitance are reduced in value. Reducing channel length decreases transit time between the source and drain while reducing parasitic capacitance decreases charging time.

The most common MOSFETS are those which utilize source and drain regions on the surface of a silicon wafer, the source and drain regions being separated by a channel region with current being controlled by a gate electrode overlying the channel region and insulated therefrom by a thin layer of silicon dioxide (often termed an IGFET).

While such devices are amenable to LSI fabrication techniques, they typically suffer from the drawback that it is difficult to make a short channel and accurately register the gate electrode thereover.

U.S. Pat. No. 4,033,026 Pashley discloses a method for fabricating MOS silicon gate transistors; Pashley does not disclose the essential concepts of the present invention and does not involve the use of a self-aligning gate whose location can be controlled with high accuracy. Further, Pashley does not appear to contemplate any embodiment whereby extremely short channel MOSFETS can be obtained.

U.S. Pat. No. 4,038,107 Marr et al relates to making short channel FETs. The method of Marr et al has the following characteristics:

The boron implant through the polysilicon window 16 into substrate 10 to form P region 17 defines the dopant (boron) concentration in the future channel. Thereafter, a thermal oxidation of polysilicon 15 to grow oxide sidewall 19 whose thickness will define the channel length is conducted. For a channel length, for instance in the range of 0.5 to 1 um, the corresponding oxide 19 thickness should be about the same (0.5 to 1 μm). The thermal oxidation is a high temperature process, and the oxide growth rate decreases rapidly with the growing oxide thickness. During the heating to oxidize polysilicon 15, the polysilicon goes through a grain growth process, which results in a roughened surface texture. Furthermore, the oxidation of silicon is orientation dependent which induces safety asperity. The combined effect of grain growth surface roughening and the orientation surface asperity makes the trace channel length varying along the channel width which can have grave consequence in controlling submicron channel length devices. In contrast, in the present invention the channel length is defined by a second polysilicon layer which can be grown at 600° C., resulting in a very smooth surface and a channel length well defined along the channel width.

Further, in Marr et al FIG. 3 after oxidation of polysilicon 15 to form oxide 19, the oxide on the monosilicon substrate under polysilicon 15 and under the window 16 show the same thickness, which is not possible unless the silicon under window 16 is masked with an oxidation mask such as silicon nitride. While Marr et al do not per se disclose masking the window surface, if there is no oxidation mask in the window area oxide growth must occur simultaneously with polysilicon 15 oxidation and oxide thickness should be comparable to the oxide 19. In subsequent phosphorus implantation, the implanting energy must be very high to penetrate the thick oxide on the monosilicon under window 16 into the substrate silicon to form N region 18. For an oxide thickness of 1 um for a 1 um channel, the phosphorus implant energy has to be about 1,400 kev, nonexistent at any practical semiconductor manufacturer. In contrast, the present invention has no polysilicon oxidation; hence, the source/drain implant only penetrates through a thin gate oxide.

Further, polysilicon 15 and its oxide 19 in FIG. 4A of Marr et al are removed and electrode 24 is formed after the channel length 17 is defined as shown in FIG. 3. Thus, the electrode is not self-aligned with the channel length as shown in FIG. 4A. In contrast, in the present invention channel length is defined by a second polysilicon growth which is an integral part of the device.

In Marr et al the large overlap between electrode 24 and source 18/drain 11 due to nonself-alignment of gate 24 to channel 17 results in a high gate capacity which degrades device performance. In contrast, the present invention has a self-aligned gate to channel and the overlap between the gate electrode and the channel can be controlled to a minimum, e.g., less than 0.1 um. As a result, device performance is enhanced by the low gate capacitance. Further, the source p-n junction of regions 17 and 18 in Marr et al occurs in a high dopant concentration region, resulting in high parasitic capacitance, which degrades device performance. In contrast, in the present invention the source p-n junction occurs in a low substrate background concentration; hence parasitic capacitance is low.

U.S. Pat. No. 4,074,300 Sakai et al discloses a self-aligned silicon gate process. The polysilicon length is defined by a photoresist process and a subsequent etch of the polysilicon. The Sakai et al process suffers from inherent large photoresist variation in the range of a few tenths of a micrometer and the complexity of the variables involved in a silicon etch. The combined variations in photoresist and silicon etch result in large variations in channel length. To make submicrometer channel devices using the Sakai et al method will result in widely varied device characteristics. In contrast, the present invention defines channel length by controlling a simple chemical vapor deposition—second polysilicon thickness—with a variation much less than 0.1 um.

U.S. Pat. No. 4,078,947 Johnson et al deals with a method for forming narrow channel length MOSFETs. While Johnson et al do use the terminology "self-aligned structure", the self-alignment concept in Johnson et al is quite different from that of the present invention, i.e., it is easily seen that in Johnson et al the "self-alignment" of the gate merely reflects the fact that the channel length is determined by the outward diffusion of the implanted boron in region 20 (FIG. 1) and the subsequent n implant or diffusion through the same opening to form region 22. Clearly the channel length 28 per Johnson et al is defined by a diffusion/implant process but not by a first polysilicon mask for implanting boron in region 22a and subsequently by a second polysilicon mask for implanting n-type dopants to form regions 29 and 32a as per the present invention. Since the channel length is formed by the outward diffusion of boron, the surface boron concentration in channel 28 varies along the channel length in Johnson et al. On the other hand, the surface dopant concentration of channel 30 per the present invention is the same along the channel length due to the implantation of uniform concentration in the channel region. Furthermore, the gate electrode of Johnson et al is formed after channel length is defined and electrode 52 is not self-aligned with channel 28, the large overlap between electrode 52 and source 22/drain 24 in Johnson et al resulting in high gate capacitance which degrades device performance.

U.S. Pat. No. 4,099,987 Jambotkar discloses a technique wherein the channel length of an bipolar transistor is controlled by the thickness of a dielectric layer deposited on the vertical walls of a mesa. The mesa and layer are removed, and are replaced by a non self-aligned gate structure.

U.S. Pat. No. 4,101,922 Tihanyi et al relates to FET's having a short channel length. A review of Tihanyi et al establishes that there is little relationship between Tihanyi et al and the present invention, and this reference is merely cited as showing an FET with a short channel length.

U.S. Pat. No. 4,173,818 Bassous et al relates to a method of fabricating transistors, most especially IGFETs having a very short effective channel. The Bassou et al teaching differs from the present invention as follows:

The channel length 34 is defined by the undercut of the tungsten layer 24 in two separate etches as shown in FIGS. 1C and 1D. Undercut etch control is a function of many variables such as tungsten thickness, grain structures, grain orientations, etchant composition— which changes continuously during etching, surface area of tungsten to be etched, etchant temperature, and rate of removal of the etching by-product at the etching tungsten surface.

Tungsten 24 is eventually removed and oversized polysilicon 20 is used as the gate electrode which extends well over the right side end of channel 34 and overlaps with the drain side n- region 16 for several micrometers, thus increasing parasitic drain capacitance which degrades device performance. In contrast, the present invention uses a precisely controlled second polysilicon thickness to define channel length and has a minimum gate to source/drain overlap of less than one-tenth of a micrometer.

The depth of channel 34 at a given implant energy depends upon the thicknesses of the polysilicon 20 and the gate oxide 18 per Bassous et al. Thus, channel depth varies with thickness variations of both the polysilicon and the gate oxide. In contrast, the present invention makes the channel implant through the gate oxide only; hence, channel depth varies with gate oxide variation only.

Per Bassous et al, the large source p-n junction occurs at a dopant concentration much higher than the substrate dopant concentration which results in high junction capacitance, whereas per the present invention the large area source p-n junction occurs at a low substrate dopant concentration.

U.S. Pat. No. 4,190,850 Tihanyi et al differs from the present invention as follows:

The channel length 121 in FIG. 4 of Tihanyi et al is defined by the slope 21 of polysilicon 21 and the gate oxide thickness. The channel length thus varies with variations of the slope and the gate oxide thickness. In contrast, the present invention precisely controls the channel length by the second polysilicon thickness.

The depth of channel 121 changes with slope 31 while the present invention has a constant channel depth.

U.S. Pat. No. 4,209,349 Ho et al differs from the present invention as follows:

In FIG. 2D of Ho et al, the device structure comprises, from source to drain, $N+36$, P30, $P-22$, P30 and $N+36$, while the present invention shows a structure per FIG. 5 from source to drain of $N+32a$ and N29, P30, $N-16$, N26 and $N+32b$.

In Ho et al, channel 30 is aligned with the edge of a dielectric sidewall 32 in FIG. 2C which eventually has to be removed and has to be released by a conductive gate electrode. In doing so, the materials above the silicon surface such as sidewall oxide 32, silicon nitride 28, and oxide 26 are all removed, an insulating layer 52 about 3,000–5,000 Å is grown, photoresist masking is conducted to selectively etch windows in region 52 to define the gate, followed by gate oxidation, again using the photoresist mask to define the source and drain contacts by etching windows in 52. Thus, the gate electrode is defined by a photoresist process which is known to have large variations and the gate electrode is not self-aligned with the channel length 30.

Commenting upon the prior art in general, the prior art has used double diffusion process (DDP) or DDP-like processes to form short channel devices. Devices made by such methods have a relatively short "electrically effective channel" but physically a long device channel is still present whether the device gate is made of aluminum or polysilicon. Thus, a large part of the channel serves no useful purpose, rather, it contributes only to parasitic capacitance. In devices formed per the present invention, channel length is defined by a short physical gate and gate to source or drain overlap is minimized, thereby greatly reducing parasitic capacitance.

SUMMARY OF THE INVENTION

The present invention provides a method for manufacturing insulated gate type field effect transistors wherein a channel of desired length, in one embodiment an extremely short channel, having a self-aligned gate is provided wherein the length of the channel is controlled by the thickness of a system of deposited polycrystalline silicon coatings on a vertical surface of a dielectric mesa or gate support. The polycrystalline silicon is retained in the final structure as the transistor gate electrode.

One object of the present invention is to provide an insulated gate type field effect transistor capable of operating at high speed and of producing high output power.

Still another object is to provide precisely controlled short channel devices in LSI and VLSI with capability to withstand high punch through voltages which typically are difficult to attain with short channels.

Yet another object is to provide precisely controlled short channel devices which can withstand high punch through voltages and avoid the injection of hot electrons into a gate oxide over a channel.

Another object of the present invention is to provide such a transistor which can be easily fabricated in high density integrated circuits.

Still yet another object of the present invention is to provide such a transistor having a very small and precisely located channel region, thereby decreasing parasitic capacitance of the source and drain regions to permit high speed operation.

A further object of the present invention is to provide a method of fabricating such a transistor by a simplified process which does not involve complex operations.

The Figures, of course, merely illustrate one small greatly enlarged portion of a silicon body which will be used to form a very dense IGFET integrated circuit.

DESCRIPTION OF THE PREFERRED EMBODIMENTS

Prior to the beginning a description of the preferred processing sequences of the invention as illustrated in FIGS. 1-5, we would like to set forth certain background consideration which we believe will be apparent to one skilled in the art.

While the following illustrates the formation of an N-channel FET transistor, obviously P-channel FET transistors can be formed using opposite conductivity type impurities.

Further, while in the following doping is typically by ion implantation, it will be appreciated by one skilled in the art that either thermal diffusion or ion implantation can be used.

Figure 1:
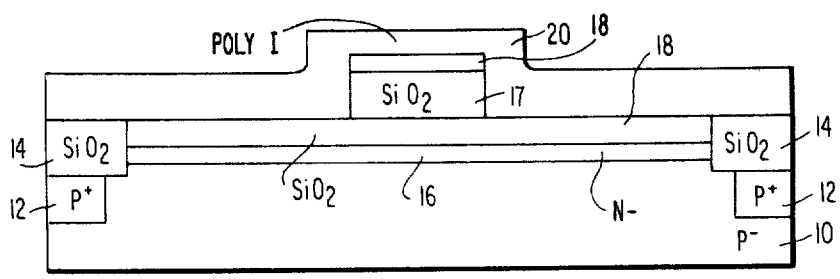
FIGS. 1-5 schematically illustrate in cross-section a process for forming a short channel IGFET per the present invention.

FIG. 1 represents an IGFET after the following production operations.

Beginning with a conventional <100> P$^-$ silicon substrate 10 at a boron doping concentration of about $5 \times 10^{14} - 5 \times 10^{15}$/cc or having a resistivity of about 2-20 ohm/cm, a conventional recessed oxide isolation (ROI) ring 14 is formed, either semi ROI or full ROI, which is well known to one skilled in the art, and a channel stopper P-ring 12 is formed immediately below ROI 14. The P-ring is usually formed by implant or diffusion, to a boron concentration of $10^{16}$ to $10^{17}$ atoms/cm$^3$, prior to the ROI oxidation through an oxidation mask, usually a temporary silicon nitride layer over a thin buffer layer of SiO$_2$ (neither of which are shown as such are conventional) to avoid stress damage to the substrate silicon 10.

Nextly, the silicon surface defined by the ROI 14 is cleaned, a thin layer of oxide (not shown) is grown and an n-type dopant (As, Sb, or P) is implanted to a concentration of about $0.5-2 \times 10^{16}$ atoms/cc through the thin oxide to form N$^-$ silicon region 16. Alternatively, the n-type dopant implant can be made without growing a thin oxide. The implanted N$^-$ region 16 depth typically ranges from about 0.2 to 0.6 um.

Following the above procedure, a SiO$_2$ layer is grown by chemical vapor deposition (CVD) over the entire surface of the device to a thickness on the order of 500 nanometers to 1 micron, for example, at 400°-850° C. and at low pressure or at atmospheric pressure using, for instance, an SiH$_4$/O$_2$ atmosphere, whereafter a conventional positive photoresist such as Shipley AZ1350 J photoresist is applied over the CVD SiO$_2$ layer and the same is exposed to ultraviolet light through an appropriate mask in a conventional fashion and developed in a conventional fashion, e.g., using J100 solution, whereafter the CVD SiO$_2$ layer is etched in a conventional fashion, for example, by directional reactive ion etching in a CF$_4$/H$_2$ atmosphere, leaving SiO$_2$ island 17 having a thickness, of course, of about 500 nanometers to 1 micron.

Reactive ion etching (often referred to as RIE herein) as is utilized in the present invention is described in detail in "A Survey of Plasma-Etching Processes" by Richard L. Bersin, published in Solid State Technology, May 1976, pages 31-36. As will be appreciated by one skilled in the art, the atmospheres utilized for RIE will vary greatly depending upon the material being etched, and the Bersin article describes such in detail and is incorporated herein by reference.

As one skilled in the art will appreciate, the figures herein present cross-sectional views of the device vertical structure; the actual (horizontal) shape and dimensions of the device may be varied according to device and circuit design.

Following formation of SiO$_2$ island 17, the Si wafers are chemically cleaned and a layer of silicon dioxide about 20-100 mm thick is thermally grown at 800°-1000° C. in dry oxygen over the entire horizontal surface of the device in a conventional fashion, whereby SiO$_2$ layer 18 is formed. For purposes of simplicity, in FIG. 1 SiO$_2$ layer 18 thus formed is not shown as grown on island 17 or over recessed SiO$_2$ isolation 14; as one skilled in the art will appreciate, however, growth would take place on all horizontal surfaces but, since at this stage SiO$_2$ is merely being deposited over existant SiO$_2$ areas in recessed SiO$_2$ isolation 14 and island 17, this is not separately shown.

Referring again to FIG. 1, a polysilicon layer 20 (hereafter this layer is merely referred to as polycrystalline silicon I to differentiate it from the later formed second polysilicon layer which will be identified as polycrystalline silicon II) is grown over the entire surface of the device by a low pressure CVD process, for example, at 50-500 millitorr using an SiH$_4$/H$_2$ atmosphere at 450°-800° C.; this procedure is conventional in the art. As shown in FIG. 1, conformal polycrystalline silicon I coating 20 results having a thickness of about 0.10-0.50 micron.

Figure 2:
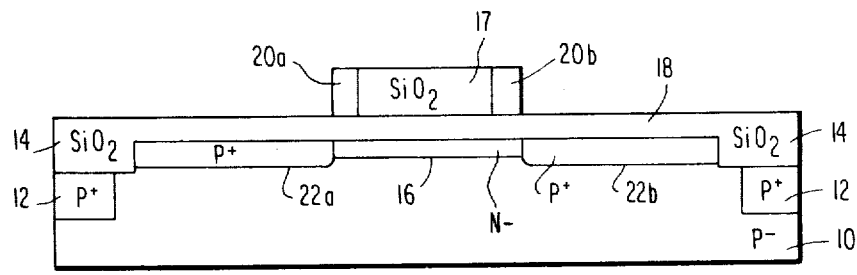

Following the above procedure, as now explained with reference to FIG. 2, where layer 18 is shown as part of SiO$_2$ isolation 14 for simplicity, directional RIE etching in a 90% Ar/10%/Cl$_2$ atmosphere is conducted in a conventional manner at room temperature to remove polycrystalline silicon I coating 20 in all horizontal areas; however, as shown in FIG. 2, this directional RIE etching does not affect polycrystalline silicon I sidewalls 20a and 20b which are grown on island 17. The purpose of forming polycrystalline silicone I sidewalls 20a and 20b will later be apparent, i.e., polycrystalline silicon I sidewall 20a in combination with a polycrystalline silicon II sidewall later to be described will permit precise location of the IGFET channel later to be described and, as will later be clear, can be used, if desired, to permit formation of an extremely short channel IGFET where the channel is precisely located.

Following formation of polycrystalline silicon I sidewalls 20a and 20b by directional RIE, thereafter a conventional boron implant is conducted at room temperature through the gate oxide to define the channel doping and to yield P zones 22a and 22b. The boron concentration is about 1 to $15 \times 10^{16}$ atoms/cm$^3$ and is typically conducted without masking to a depth of about 0.20-0.70 mm. Only a portion of zone 22a will become the actual channel.

As illustrated in FIG. 2, following the above procedure the surface of the device is masked with a conventional photoresist such as AZ1350 J which is masked, exposed and developed in a conventional manner, whereby all horizontal surfaces of the device are provided with photoresist coating 24 except over zone 22b where photoresist coating 24 has been removed (developed).

Figure 3:
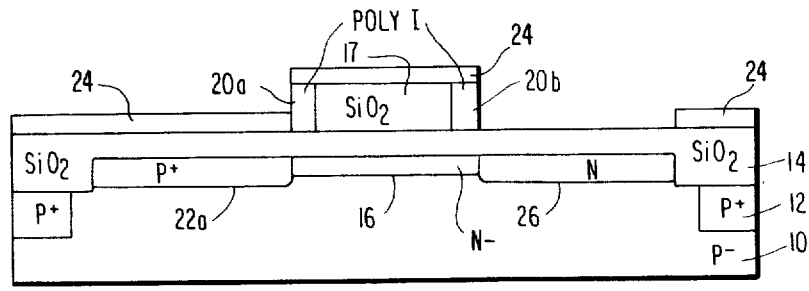

With reference to FIG. 3, following selective photoresist removal over zone 22b which had earlier received the indicated boron implantation, a phosphorus ion implantation is conducted to a high phosphorus doping level (greater than the doping level selected for the channel boron implantation which yields zones 22a and 22b, for example, up to about 1.5 to $10^{17}$ atoms/cm$^3$), thereby resulting in zone 26 which is a highly doped N phosphorus zone, as shown in FIG. 3. Since the phosphorus concentration is greater than the initial boron concentration in zone 22b, P zone 22b as shown in FIG. 2 is converted to N zone 26 as shown in FIG. 3. All other areas of the device, being masked, do not receive the phosphorous implant. Phosphorus ion implantation is typically at a dose of $1.0-15 \times 10^{12}$/cm$^2$ to a depth of about 0.30–0.80 mm.

After the above procedure, the photoresist layer 24 is removed in a conventional manner, e.g., by an O$_2$ plasma etch.

It is to be noted that the boron ion implantation which results in P zones 22a and 22b and the phosphorous ion implantation which converts P zone 22b to N zone 26 can be reversed in sequence with equivalent results being obtained.

Figure 4:
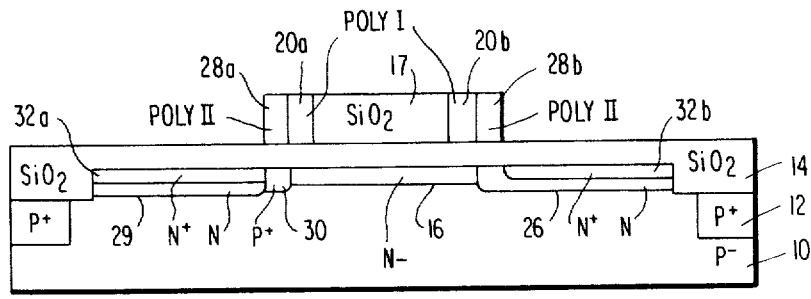

Referring now to FIG. 4, the next process step according to the present invention is to grow a polycrystalline silicon II layer in a manner similar to that utilized to grow polycrystalline silicon I layer 20, i.e., low pressure CVD deposition at the above conditions, followed by RIE directional etching at the above conditions, whereafter polycrystalline silicon II islands 28a and 28b result as shown in FIG. 4. It is to be noted that there is no compositional difference of substance between the polycrystalline silicon I and polycrystalline silicon II islands, and these are illustrated as separate in FIG. 4 for purposes of explanation.

In a typical short channel IGFET, assuming a desired channel length of 5,000 Å, polycrystalline silicon I sidewalls 20a and 20b would have a thickness of about 2,000 Å and polycrystalline silicon II sidewalls 28a and 28b would have a thickness of about 5,000 Å. It is important that polycrystalline silicon I sidewall 20a have a lateral dimension greater than the lateral length of boron diffusion from the device channel during subsequent processing as will later be explained in detail.

Still referring to FIG. 4, following the above procedure a conventional phosphorus implantation at the earlier indicated phosphorus implantation conditions is conducted to a high phosphorus concentration, e.g., up to about $10^{17}$ to $10^{18}$ atoms/cm$^3$, over the entire surface of the device. There is no need to mask during this phosphorus ion implantation since the phosphorus is firstly desirable in the polycrystalline silicon I and polycrystalline silicon II sidewalls, SiO$_2$ island 17 and SiO$_2$ isolation ring 14 are both too thick to be influenced by this ion implantation and the phosphorus has no detrimental effect on the original phosphorus implantation which resulted in N phosphorus doped zone 26. Further, polycrystalline silicon I sidewalls 20a and 20b and polycrystalline silicon II sidewalls 28a and 28b are too thick to permit implantation of the phosphorus ions into the areas thereunder.

As a consequence of the above phosphorus ion implantation, that portion of zone 22a (original P region) which is not protected by polycrystalline silicon II sidewall 28a receives a heavy phosphorus dope whereas that area of zone 22a under polycrystalline silicon II sidewall 28a does not receive the phosphorus dope since it is shielded by polycrystalline silicon II sidewall 28a and retains its original P character, as illustrated by element 30 in FIG. 4; since that portion of zone 22a not protected by polycrystalline silicon II sidewall 28a is converted from P to N type, it is indicated as zone 29 in FIG. 4. On the other hand, since zone 26 merely receives an additional phosphorus ion implant, it is still designated as numeral 26 in FIG. 4.

As one skilled in the art will appreciate, arsenic ion implantation can be used in the place of phosphorus ion implantation to effect the above stated N regions shown respectively as 26 and 29 in FIG. 4. In addition, multiple ion implantation can be used if necessary to effect the desired dopant profile.

Following the above procedure, a conventional arsenic ion implantation is conducted over the entire surface of the device (again, masking is not necessary for the essential reasons as advanced with respect to the second phosphorus ion implantation above). Whereas the second phosphorus ion implantation above discussed is to a depth of about 3,000–7,000 Å in the device, the arsenic ion implantation is a shallow implantation to improve channel voltage breakdown and is typically at 20–100 KeV and an arsenic dose density of about $1 \times 10^{15}$ to $1 \times 10^{16}$/cm$^2$ in areas which are not protected by the polycrystalline silicon I and polycrystalline silicon II sidewalls or SiO$_2$ island 17, resulting in the formation of N+ arsenic zones 32a and 32b shown in FIG. 4.

Figure 5:
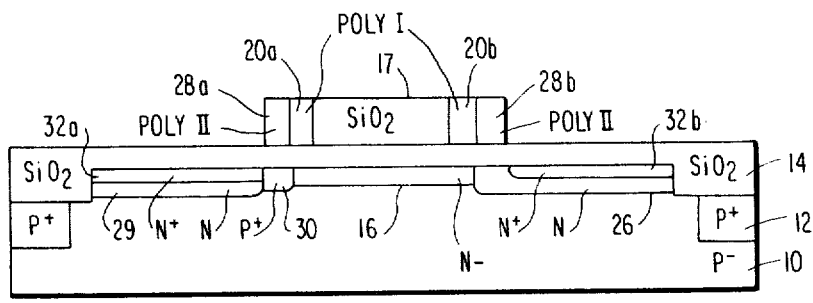

In this particular instance, the IGFET is assumed to function as a control gate device; as will be apparent to one skilled in the art, if the device were to be utilized as a charge storage device, the drain and source locations would be reversed in FIG. 5.

With reference to FIG. 5, the combination of N phosphorus doped zone 29 and N+ arsenic doped zone 32a will function as the source region.

The N− (or N+, albeit N− doping is preferred) region 16 will serve as a part of the drain region, which drain region comprises the combination of phosphorus doped zone 26 and N+ arsenic doped zone 32b. P boron doped zone 30, of course, serves as the channel of the IGFET illustrated.

Polycrystalline silicon I sidewall 20a and polycrystalline silicon II sidewall 28a will, of course, serve as the gate of the IGFET illustrated.

For the above device, it can be seen that the length of the channel 30 is very accurately controlled by the length of polycrystalline silicon II sidewall 28a which, in combination with recessed SiO$_2$ isolation 14, essentially serves as a mask for the dominating N phosphorus implantation which results in partially converting P zone 22a to N zone 29 with remaining P channel 30. Channel 30 is thus seen to be inherently self-aligning under the IGFET gate and its location and length are controlled by a combination of CVD/RIE which is inherently controllable with more precision, typically, on the order of 10 times better than that achievable by conventional photolithographic techniques.

As one skilled in the art will appreciate, of course, during the post implant annealing there will be some lateral diffusion of P boron channel 30, and since it is desired that the gate overlie channel 30 with high accuracy, the lateral diffusion of P channel 30 into N− region 16 to its right should not extend beyond the inner dimension of polycrystalline silicon I sidewall 20a. Thus, it is necessary that polycrystalline silicon I sidewall 20a have a lateral dimension greater than the expected length of the lateral diffusion of boron in channel 30 during the post implant annealing and any subsequent heating(s). One skilled in the art using conventional techniques will easily be able to predict in advance the expected length of lateral diffusion of boron in channel 30.

The above IGFET thus has an extremely short channel, and exhibits very low capacitance.

It should be noted that polycrystalline silicon I sidewalls 20a and 20b, as well as polycrystalline silicon II sidewalls 28a and 28b, are physically connected around the sidewall of the oxide island 17. To minimize gate capacitance, the polycrystalline silicon I 20a/polycrystalline silicon II 28a sidewalls should be physically separated from the polycrystalline silicon I/polycrystalline silicon II sidewalls 20b and 28b by etching through a mask. In fact, the polycrystalline silicon I 20b and polycrystalline silicon II 28b sidewalls can be removed altogether without adversely affecting the device performance, if desired.

The above IGFET has an extremely short channel, and exhibits very low capacitance.

It is known to one skilled in the art that a short channel device usually has a low punch-through voltage and low channel breakdown strength. These problems are overcome by the present invention by the N− region 16 in FIG. 5. The presence of the N− region 16 between the N+ region 32b drain and the channel 30 allows the drain potential to spread over this N− region, thereby overcoming the low punch-through voltage and low channel breakdown problems.

Furthermore, because the gate electrode comprising polycrystalline silicon I sidewall 20a and poly II sidewall 28a are far away from the drain N+ region 32b, hot electron injection into the gate oxide under the gate electrode when the drain is biased at high voltage will be greatly reduced. The injection of hot electrons into the gate oxide induces device instability. The combined features of the precisely controlled short channel which can be operated at high drain voltages without injecting hot electrons into the gate oxide is one unique characteristic of the present invention.

While the invention has been described in detail and with reference to specific embodiments thereof, it will be apparent to one skilled in the art that various changes and modifications can be made therein without departing from the spirit and scope thereof.

What is claimed is:

1. A method of forming a transistor which comprises:
   (a) providing a semiconductor substrate of one conductivity type having a shallow surface layer of opposite conductivity type;
   (b) forming a thick mesa of dielectric material on said substrate;
   (c) forming a first layer of polycrystalline silicon only on the vertical surfaces of said mesa by reactive ion etching;
   (d) introducing at least one impurity into said substrate, said mesa and said first layer of polycrystalline silicon masking said substrate against the introduction of said at least one impurity;
   (e) forming a second layer of polycrystalline silicon by reactive ion etching;
   (f) introducing at least one impurity of a different conductivity type from said first at least one impurity into said substrate at areas other than those masked by said mesa, said first polycrystalline silicon layer and said second polycrystalline silicon layer to thereby form the gate of said transistor.

2. The method of claim 1 which further comprises forming an annular layer of dielectric isolation on said substrate around said mesa, thereby producing a defined area between said mesa and said annular layer of dielectric isolation.

3. The method of claim 2 wherein the at least one impurity introduced in step (d) is introduced into said defined area.

4. The method of claim 3 wherein a portion of said defined area is masked subsequent to introducing the at least one impurity in step (d) but prior to the forming of said second layer of polycrystalline silicon in step (e) and wherein at least one impurity of a conductivity type opposite the conductivity type of the at least one impurity introduced in step (d) is introduced into the unmasked portion of said defined area.

5. The method of claim 2 wherein the annular layer of dielectric isolation is formed prior to step (a).

6. The method of claim 2 wherein only one impurity is introduced during step (d) which has a conductivity type opposite that of the shallow surface layer of step (a), and which is p type, wherein two impurities are introduced during step (f) and wherein the annular layer of dielectric isolation is formed prior to step (b).

7. The method of claim 1 wherein the at least one impurity introduced during step (d) has a conductivity type opposite that of the shallow surface layer of step (a).

8. The method of claim 7 where the conductivity type of the shallow surface layer is n type and the conductivity type of the at least one impurity introduced during step (d) is p type.

9. The method of claim 8 wherein during step (f) two impurities are sequentially introduced.

* * * * *